(12) United States Patent
Matsuzuka

(10) Patent No.: US 7,088,194 B2
(45) Date of Patent: Aug. 8, 2006

(54) SEMICONDUCTOR INTEGRATED CIRCUIT DEVICE

(75) Inventor: Takayuki Matsuzuka, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/762,338

(22) Filed: Jan. 23, 2004

(65) Prior Publication Data

US 2004/0150482 A1   Aug. 5, 2004

(30) Foreign Application Priority Data

Jan. 23, 2003   (JP) .............................. 2003-014645

(51) Int. Cl.
*H03B 5/18*   (2006.01)

(52) U.S. Cl. ............................... 331/117 D; 331/117 R

(58) Field of Classification Search ............ 331/117 D, 331/117 R
See application file for complete search history.

(56) References Cited

U.S. PATENT DOCUMENTS

| | | | | |
|---|---|---|---|---|
| 4,547,750 A | * | 10/1985 | Torizuka et al. | 331/99 |
| 5,200,713 A | * | 4/1993 | Grace et al. | 331/49 |
| 5,225,793 A | * | 7/1993 | Higashiyama et al. | 331/158 |
| 5,309,119 A | * | 5/1994 | Shiga | 331/99 |
| 5,341,111 A | * | 8/1994 | Miya et al. | 331/96 |
| 2004/0095198 A1 | * | 5/2004 | Yeh | 331/117 R |

FOREIGN PATENT DOCUMENTS

JP        64-5206       1/1989

* cited by examiner

*Primary Examiner*—Joseph Chang
(74) *Attorney, Agent, or Firm*—Leydig, Voit & Mayer, Ltd.

(57) ABSTRACT

In an oscillator, a FET, an output matching circuit having a diode, an LC series resonant circuit having a capacitor and an inductor, a transmission line, and a source inductor are arranged on one surface of a substrate consisting of a semiconductor material. The source of the FET is grounded through a source inductor. The drain of the FET is connected to the anode of the diode of the output matching circuit through a transmission line. The FET amplifies a high-frequency signal input to the gate, and outputs the high-frequency signal from the drain to an output matching circuit. The diode regulates an oscillation power.

4 Claims, 10 Drawing Sheets

US 7,088,194 B2

SEMICONDUCTOR INTEGRATED CIRCUIT DEVICE

BACKGROUND OF THE INVENTION

1. Field of the Invention

The present invention relates to a semiconductor integrated circuit device, more particularly to an oscillator which is principally operated in a microwave or millimetric-wave region.

2. Description of the Related Art

An oscillator composed of a semiconductor integrated circuit is well known. In the oscillator, on a substrate, there are provided a resonant circuit for generating a high-frequency signal having a predetermined frequency, and a transistor for amplifying the high-frequency signal (for example, see Japanese Laid-open Patent Publication No. 64-5206).

In the conventional oscillator of this type, it is probable that an excessive power is inputted to the transistor in an equilibrium state of oscillation causing device breakdown or deterioration of noise characteristic. Therefore, in the conventional oscillator, in general, in order to avoid these disadvantages, the small signal loop gain is decreased to achieve the equilibrium state of oscillation by a lower electric power.

As described above, in the conventional oscillator, in order to reduce the power inputted to the transistor in the equilibrium state of oscillation, the small signal loop gain is decreased to achieve the equilibrium state of oscillation by a lower power. Consequently, in the conventional oscillator, for example, the variation in characteristic to the variation in gain of the transistor is increased due to the variations in the environment temperature or manufacturing condition or the like. Thus, a countermeasure for an excessive input of the power cannot be actually achieved in many cases.

SUMMARY OF THE INVENTION

The present invention, which has been developed to solve the conventional problems described above, provides a semiconductor integrated circuit device or an oscillator which can decrease an oscillation power when an equilibrium state of oscillation is achieved, without decreasing a small signal loop gain.

A semiconductor integrated circuit device according to the present invention, which has been achieved to solve the above-mentioned problems, is characterized in that it has a circuit structure for regulating the power amplitude by using a diode. More specifically, in the semiconductor integrated circuit device, a resonant circuit, a transmission line, an active element and an output-matching circuit are arranged on one main surface (or a spreading surface) of a substrate. The resonant circuit resonates at an arbitrary (or predetermined) frequency. The transmission line has an end portion connected to the resonant circuit and transmits a high-frequency signal of the frequency. The active element has a first electrode connected to the other end portion of the transmission line, a second electrode which is grounded through a reactance element, and a third electrode. The output-matching circuit includes a diode section for regulating an oscillation power and a high-frequency signal output terminal. An end portion of the diode section is connected to the third electrode of the active element. The high-frequency signal output terminal is connected to the other end portion of the diode section.

As described above, the semiconductor integrated circuit device according to the present invention has a circuit structure which regulates the power amplitude by using the diode. Consequently, the oscillation power obtained when the equilibrium state of oscillation is achieved, can be decreased without decreasing the small signal loop gain.

BRIEF DESCRIPTION OF THE DRAWINGS

Various characteristics and advantages of the present invention will become clear from the following description taken in conjunction with the preferred embodiments with reference to the accompanying drawings throughout which like parts are designated by like reference numerals, in which.

DETAILED DESCRIPTION OF THE PREFERRED EMBODIMENTS

Several embodiments of the present invention will be described below with reference to the accompanying drawings.

First Embodiment

Figure 1:
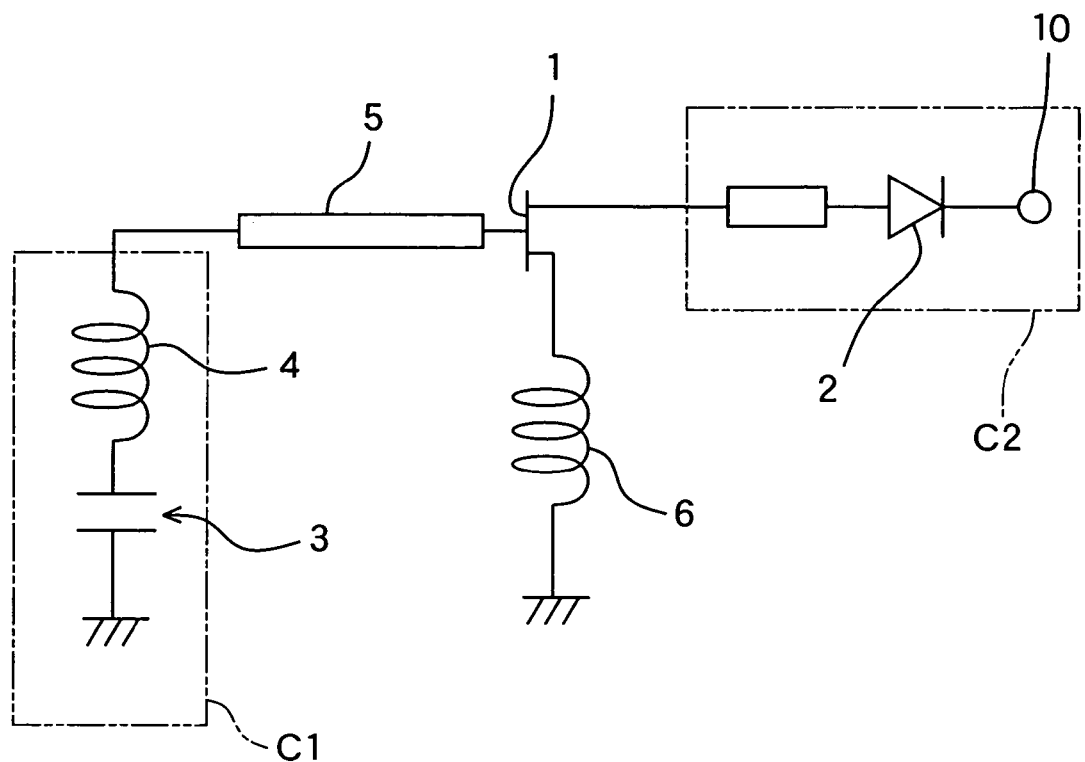
FIG. 1 is a circuit diagram of an oscillator according to the first embodiment of the present invention.
Figure 2:
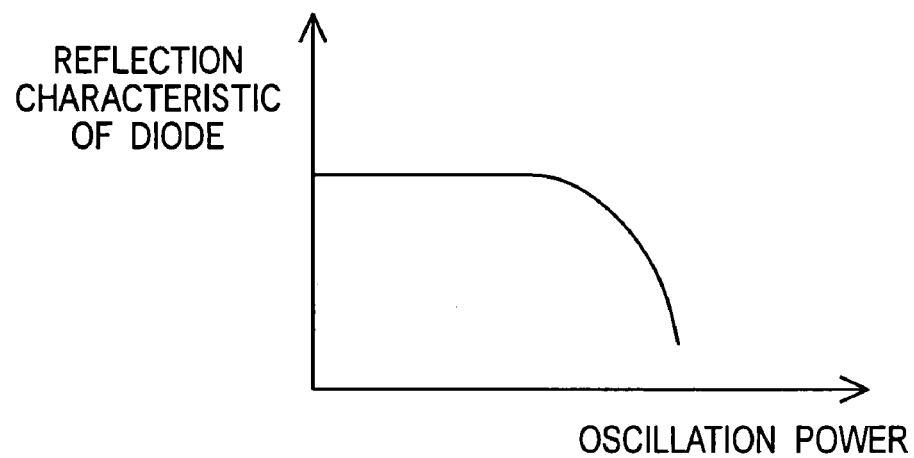
FIG. 2 is a graph showing a relationship between a reflection characteristic of a diode and an oscillation power in the oscillator shown in FIG. 1.
Figure 3:
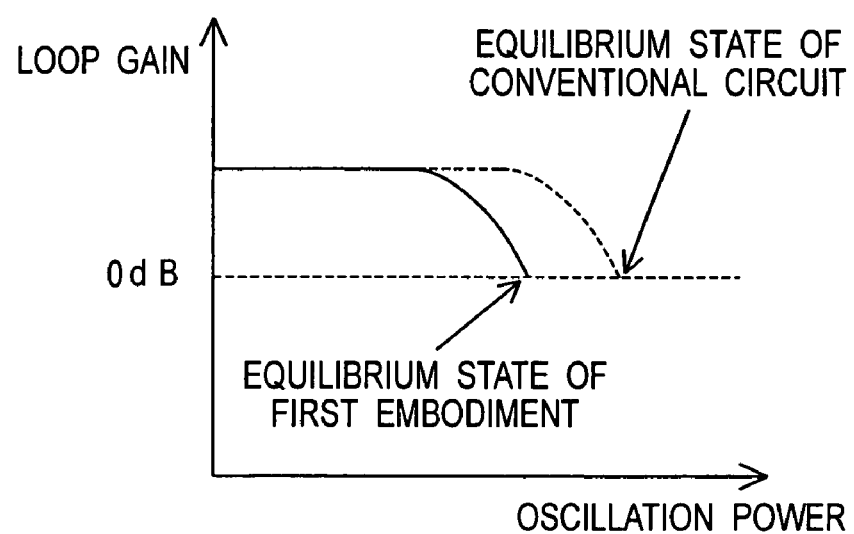
FIG. 3 is a graph showing a relationship between a loop gain and an oscillation power in the oscillator shown in FIG. 1.

With reference to FIGS. 1 to 3, the first embodiment of the present invention will be described below. FIG. 1 shows the oscillator according to the first embodiment of the present invention. FIG. 2 shows the relationship between the reflection characteristic of a diode and the oscillation power in the oscillator shown in FIG. 1. FIG. 3 shows the relationship between the loop gain and the oscillation power in the oscillator shown in FIG. 1.

As shown in FIG. 1, in the oscillator (semiconductor integrated circuit device) according to the first embodiment, a FET 1 (field effect transistor), an output-matching circuit C2 having a diode 2 and an output terminal 10, an LC series resonant circuit C1 having a capacitor 3 and an inductor 4, a transmission line 5, and a source inductor 6 are arranged on one main surface (spreading surface) of a substrate (not shown) composed of a semiconductor material.

The capacitor 3 and the inductor 4 constituting the LC series resonant circuit C1 are connected in series with each other. One counter electrode of the capacitor 3 is grounded, while the other counter electrode is connected to one end of the inductor 4. The other end of the inductor 4 is connected to one end of the transmission line 5. In this manner, when oscillating electric signals are supplied from the outside to the LC series resonant circuit C1, the LC series resonant circuit C1 resonates at a predetermined frequency (resonant frequency) to generate a high-frequency signal having the resonant frequency, and outputs the high-frequency signal to the transmission line 5. A variable capacitor (e.g. a varactor diode) may be used in place of the capacitor 3. In this case, when the capacitance of the variable capacitor is changed, the oscillation frequency can be changed.

The other end of the transmission line 5 is connected to the gate (first electrode) of the FET 1. In consequence, the transmission line 5 transmits the high-frequency signal having the resonant frequency, which is inputted from the LC series resonant circuit C1, to the gate of the FET 1. In this case, the transmission line 5 determines the phase condition of the high-frequency signal.

The source (second electrode) of the FET 1 is grounded through the source inductor 6 (reactance element). The drain (third electrode) of the FET 1 is connected to the anode of the diode 2 constituting the output-matching circuit C2. The FET 1 amplifies the high-frequency signal inputted into the gate, and outputs the high-frequency signal from the drain to the output-matching circuit C2 (diode 2). The diode 2 regulates the oscillation power. The cathode of the diode 2 is connected to the output terminal 10 for outputting the high-frequency signal to the outside.

As described above, in the oscillator according to the first embodiment, the FET 1 is used as an active element. However, any active element of another type, e.g. a bipolar transistor may be used in place of the FET 1. In FIG. 1, the bias circuit of the FET 1 is omitted to simplify the drawing. The same applies to the following second to eighth embodiments 2.

In the oscillator shown in FIG. 1, the diode 2 is arranged to have a forward direction from the FET 1 to the output terminal 10. However, the diode 2 may be arranged to have a reverse direction opposing the direction shown in FIG. 1. The circuits described above may be integrally formed on the semiconductor substrate like, e.g. an MMIC (Monolithic Microwave Integrated Circuit). In addition, the circuit parts may be mounted after a transmission line pattern is formed on a ceramic substrate or the like.

In the oscillator according to the first embodiment, as the oscillation power increases with growth of oscillation, the amplitude of the voltage applied across both the ends of the diode 2 increases. When the forward voltage applied to the diode 2 exceeds a threshold voltage, the impedance of the diode 2 decreases. In this case, as shown in FIG. 2, the rate of the power reflected by the diode 2 decreases. As the result, as shown in FIG. 3, the loop gain in the entire circuit decreases. Therefore, the oscillation power obtained when the equilibrium state of oscillation is achieved, can be made smaller than that of a conventional oscillator without decreasing the small-signal loop gain.

Second Embodiment

The second embodiment of the present invention will be described below with reference to FIGS. 4 and 5. However, the oscillator according to the second embodiment and the oscillator according to the first embodiment shown in FIG. 1 have a lot in common. Therefore, different points between the oscillator according to the second embodiment and the oscillator according to the first embodiment will be mainly described below to avoid overlapped descriptions.

Figure 4:
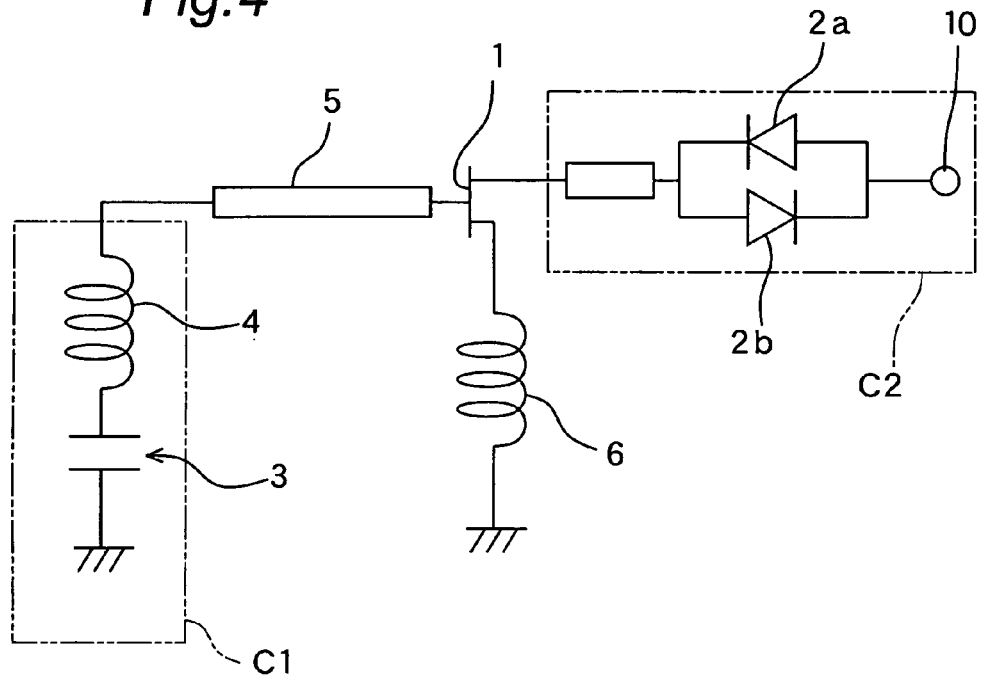
FIG. 4 is a circuit diagram of an oscillator according to the second embodiment of the present invention.
Figure 5:
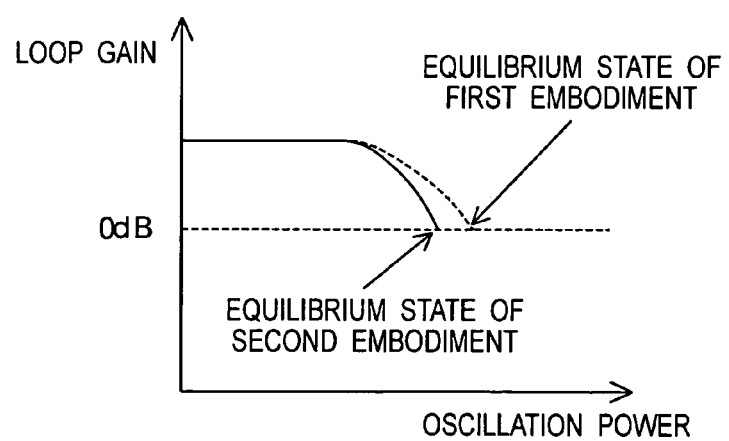
FIG. 5 is a graph showing a relationship between a loop gain and an oscillation power in the oscillator shown in FIG. 4.

FIG. 4 shows the oscillator according to the second embodiment. FIG. 5 shows the relationship between the loop gain and the oscillation power in the oscillator shown in FIG. 4. As shown in FIG. 4, in the oscillator according to the second embodiment, the output-matching circuit C2 is provided with two diodes 2a and 2b which are arranged and connected in an inverse parallel manner. The other points are equal to those of the oscillator according to the first embodiment.

In the oscillator according to the second embodiment, since the two diodes 2a and 2b are arranged in the inverse parallel manner, the same effect as that of the oscillator according to the first embodiment can be obtained on both the positive potential side and the negative potential side regarding to the amplitude of the oscillation power. In the oscillator according to the first embodiment, the effect can be obtained on only one side because only one diode 2 is arranged. In this manner, as shown in FIG. 5, in the oscillator according to the second embodiment, the oscillation power obtained when the equilibrium state of oscillation is achieved, can be made smaller than that in the first embodiment without decreasing the small-signal loop gain.

Third Embodiment

The third embodiment of the present invention will be described below with reference to FIGS. 6 and 7. Since the oscillator according to the third embodiment and the oscillator according to the first embodiment shown in FIG. 1 have a lot in common, different points between the oscillator according to the third embodiment and the oscillator according to the first embodiment will be mainly described below.

Figure 6:
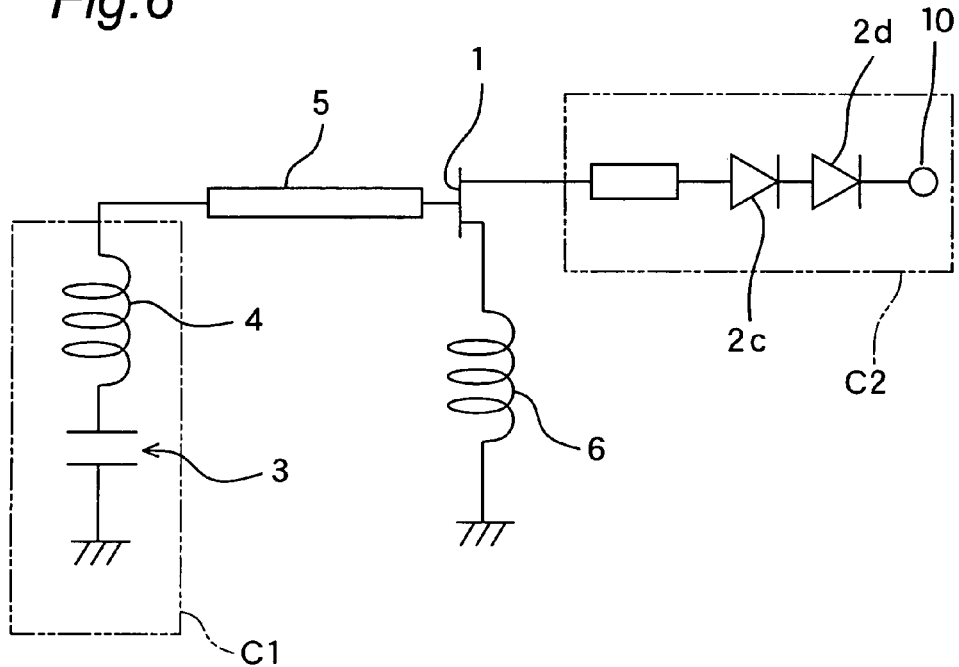
FIG. 6 is a circuit diagram of an oscillator according to the third embodiment of the present invention.
Figure 7:
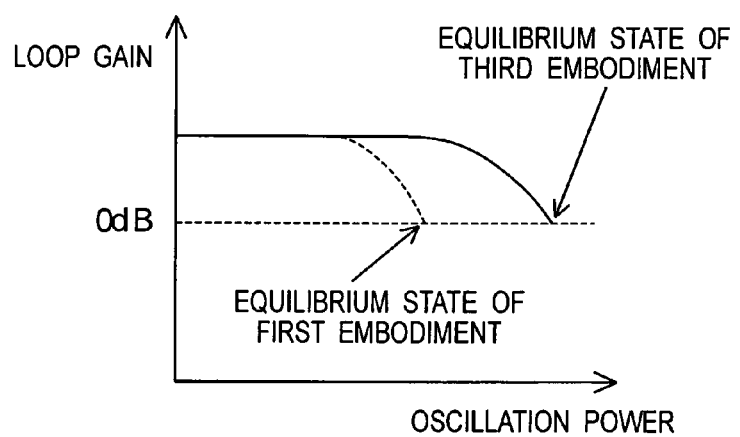
FIG. 7 is a graph showing a relationship between a loop gain and an oscillation power in the oscillator shown in FIG. 6.

FIG. 6 shows the oscillator according to the third embodiment. FIG. 7 shows the relationship between the loop gain and the oscillation power in the oscillator shown in FIG. 6. As shown in FIG. 6, in the oscillator according to the third embodiment, the output-matching circuit C2 is provided with two diodes 2c and 2d which are arranged or connected in series with each other in the same direction. The other points are equal to those of the oscillator according to the first embodiment. The two diodes 2c and 2d may be arranged in the direction opposing the direction in FIG. 6.

In the oscillator according to the third embodiment, since the two diodes 2c and 2d are arranged in series with each other in the same direction, voltages applied to the diodes 2c and 2d are lower than those in the first embodiment. In consequence, as shown in FIG. 7, the oscillation power obtained when the equilibrium state of oscillation is achieved, can be made larger than that in the first embodiment in the range smaller than that of a conventional oscillator without decreasing the small-signal loop gain.

Fourth Embodiment

The fourth embodiment of the present invention will be described below with reference to FIGS. 8 and 9. Since the oscillator according to the fourth embodiment and the oscillator according to the first embodiment shown in FIG. 1 have a lot in common, different points between the oscillator according to the fourth embodiment and the oscillator according to the first embodiment will be mainly described below.

Figure 8:
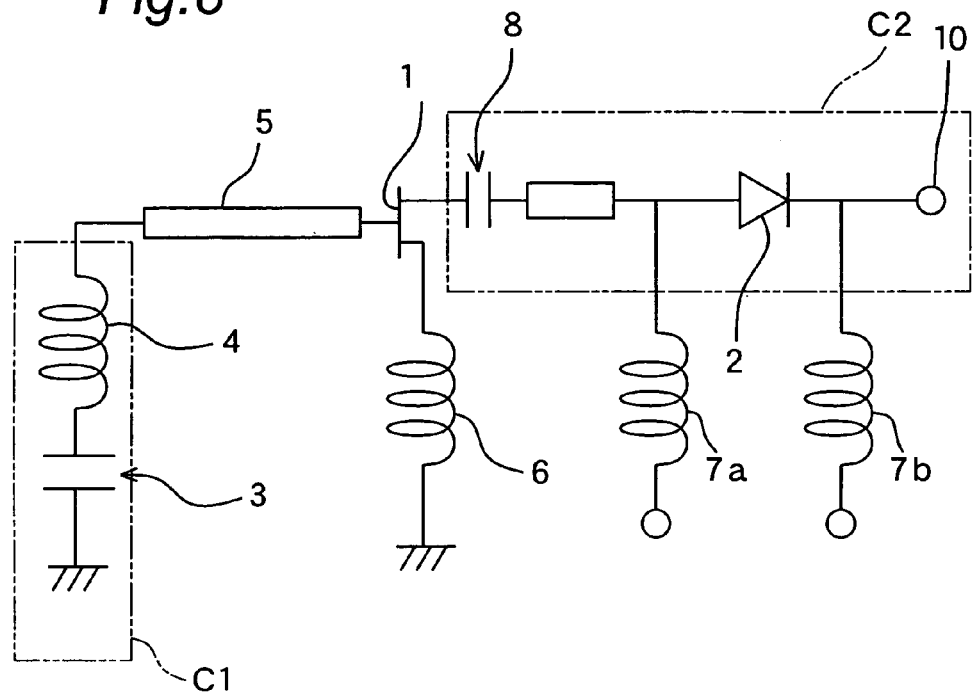
FIG. 8 is a circuit diagram of an oscillator according to the fourth embodiment of the present invention.
Figure 9:
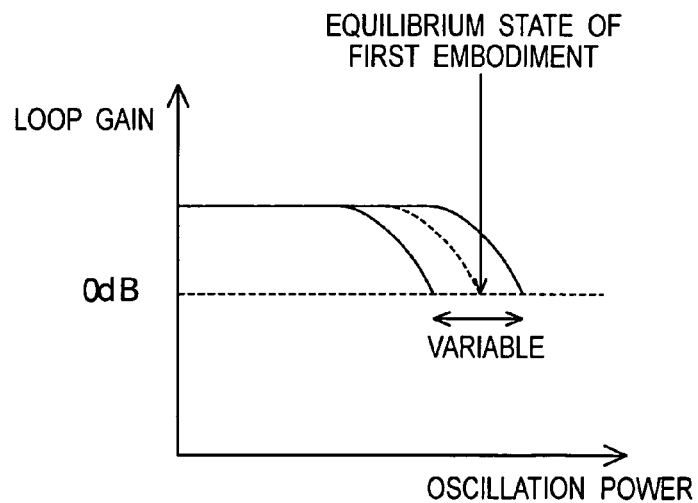
FIG. 9 is a graph showing a relationship between a loop gain and an oscillation power in the oscillator shown in FIG. 8.

FIG. 8 shows the oscillator according to the fourth embodiment. FIG. 9 shows the relationship between the loop gain and the oscillation power in the oscillator shown in FIG. 8. As shown in FIG. 8, in the oscillator according to the fourth embodiment, two choke inductors 7a and 7b (bias circuits) for applying DC biases to the diode 2 are arranged at portions on the anode and cathode sides of the diode 2, respectively. In addition, the output-matching circuit C2 is provided with a DC blocking capacitor 8. The other points are the same as those in the oscillator according to the first embodiment. The diode 2 may be arranged in the direction opposing the direction of the diode 2 in FIG. 8.

In the oscillator according to the fourth embodiment, since the DC biases can be applied to the diode 2, the center voltage of the amplitude of the high-frequency voltage applied to the diode 2 can be set to an arbitrary voltage. In consequence, as shown in FIG. 9, the oscillation power obtained when the equilibrium state of oscillation is achieved, can be made equal to an arbitrary value in the range smaller than that of a conventional oscillator without decreasing the small-signal loop gain.

Fifth Embodiment

Figure 11:
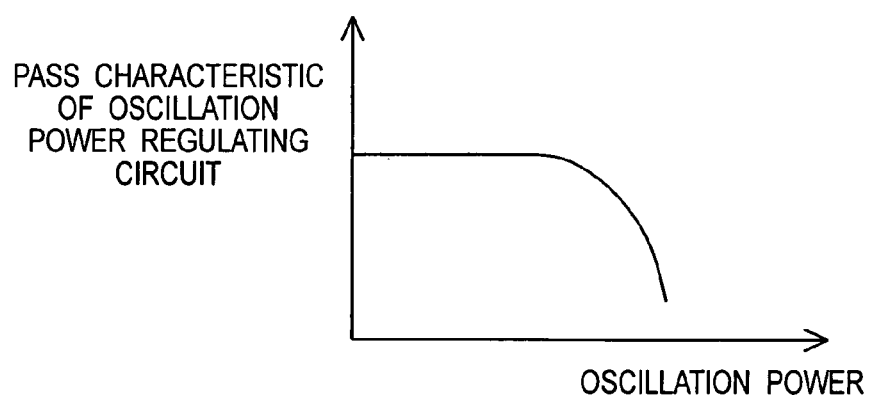
FIG. 11 is a graph showing a relationship between a pass characteristic of an oscillation power regulating circuit and an oscillation power in the oscillator shown in FIG. 10.
Figure 12:
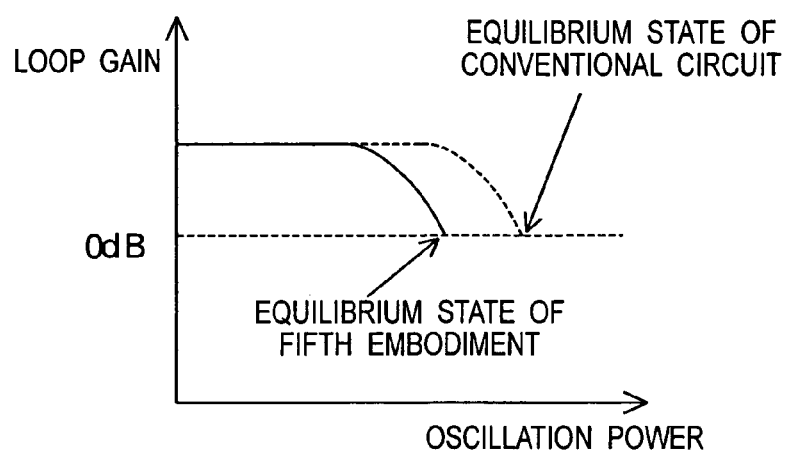
FIG. 12 is a graph showing a relationship between a loop gain and an oscillation power in the oscillator shown in FIG. 10.

The fifth embodiment of the present invention will be described below with reference to FIGS. 10 to 12. Since the oscillator according to the fifth embodiment and the oscillator according to the first embodiment shown in FIG. 1 have a lot in common, different points between the oscillator according to the fifth embodiment and the oscillator according to the first embodiment will be mainly described below.

Figure 10:
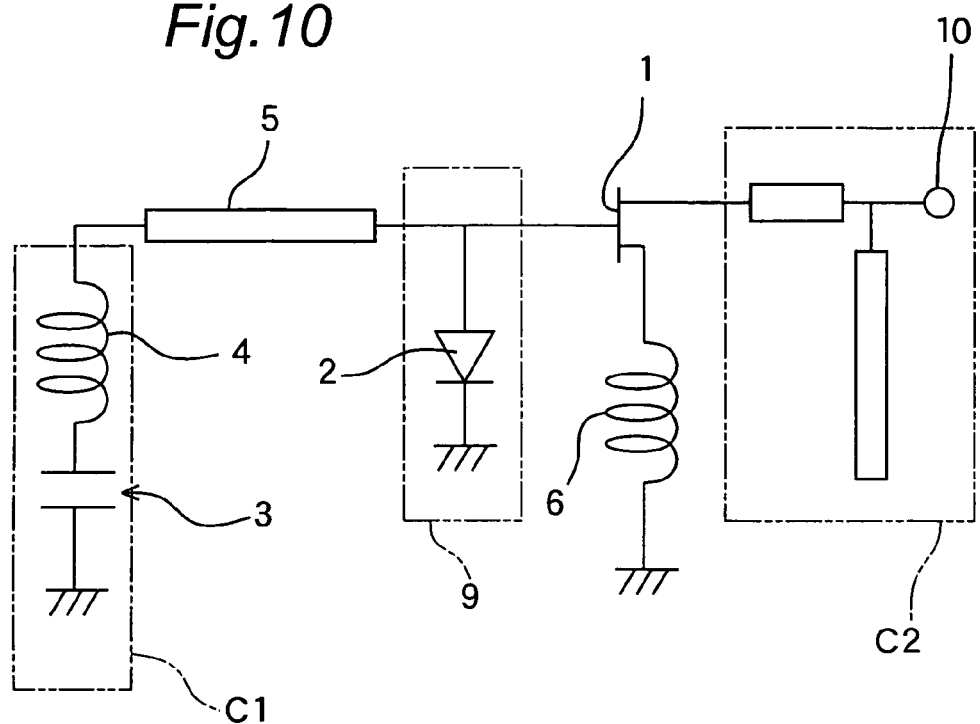
FIG. 10 is a circuit diagram of an oscillator according to the fifth embodiment of the present invention.

FIG. 10 shows the oscillator according to the fifth embodiment. FIG. 11 shows the relationship between the pass characteristic of the oscillation power regulating circuit using a diode and the oscillation power in the oscillator shown in FIG. 10. FIG. 12 shows the relationship between the loop gain and the oscillation power in the oscillator shown in FIG. 10.

As shown in FIG. 10, in the oscillator according to the fifth embodiment, an amplitude power regulating circuit 9 for regulating the oscillation power by using the diode 2 is arranged at a portion between the transmission line 5 and the FET 1. The anode of the diode 2 is connected to the line between the transmission line 5 and the gate of the FET 1, and the cathode of the diode 2 is grounded. In this oscillator, any diode for regulating an oscillation power is not arranged in the output-matching circuit C2. The other points are equal to those in the oscillator according to the first embodiment. The diode 2 may be arranged in the direction opposing the direction of the diode 2 in FIG. 10.

In the oscillator according to the fifth embodiment, as the oscillation power increases with growth of oscillation, the amplitude of the power applied across both the ends of the diode 2 increases. When a forward voltage applied to the diode 2 exceeds a threshold voltage, the impedance of the diode 2 decreases. In this case, as shown in FIG. 11, the rate of the power passing through the amplitude power regulating circuit 9 decreases. As the result, as shown in FIG. 12, the loop gain in the entire circuit decreases. Therefore, the oscillation power obtained when the equilibrium state of oscillation is achieved, can be made smaller than that of a conventional oscillator without decreasing the small-signal loop gain.

Sixth Embodiment

The sixth embodiment of the present invention will be described below with reference to FIGS. 13 and 14. However, the oscillator according to the sixth embodiment and the oscillator, according to the fifth embodiment shown in FIG. 10 have a lot in common. Therefore, different points between the oscillator according to the sixth embodiment and the oscillator according to the fifth embodiment will be mainly described below to avoid overlapped descriptions.

Figure 13:
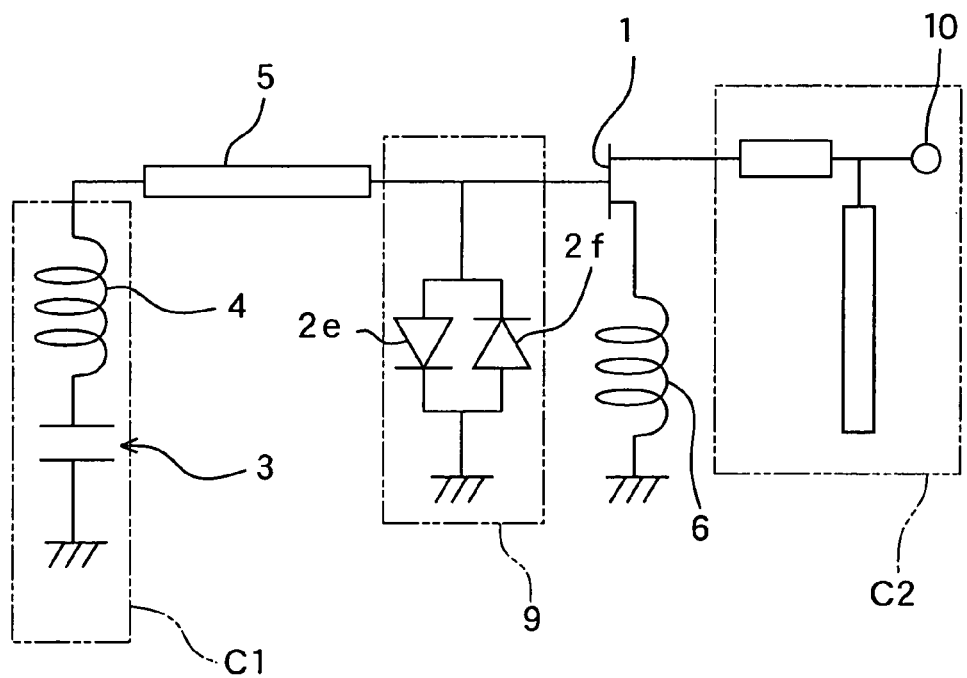
FIG. 13 is a circuit diagram of an oscillator according to the sixth embodiment.
Figure 14:
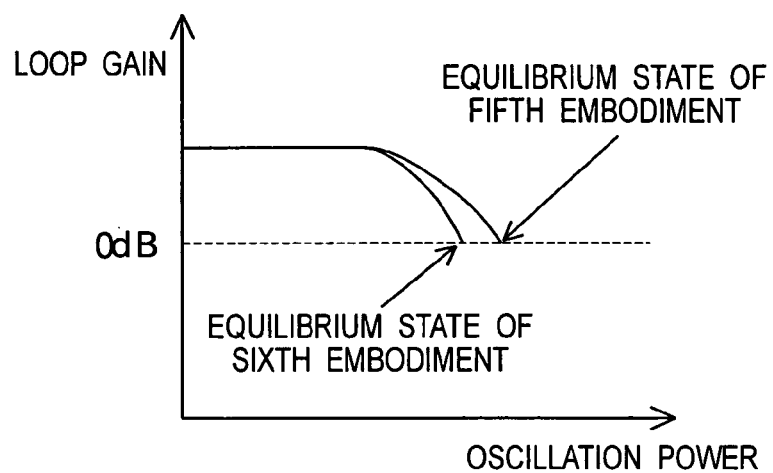
FIG. 14 is a graph showing a relationship between a loop gain and an oscillation power in the oscillator shown in FIG. 13.

FIG. 13 shows the oscillator according to the sixth embodiment. FIG. 14 shows the relationship between the loop gain and the oscillation power in the oscillator shown in FIG. 13. As shown in FIG. 13, in the oscillator according to the sixth embodiment, the amplitude power regulating circuit 9 is provided with two diodes 2e and 2f which are arranged or connected in an inverse parallel manner. The other points are equal to those of the oscillator according to the fifth embodiment.

In the oscillator according to the sixth embodiment, since the two diodes 2e and 2f are arranged in the inverse parallel manner in the amplitude power regulating circuit 9, the same effect as that of the oscillator according to the fifth embodiment can be obtained on both the positive potential side and the negative potential side, regarding to the amplitude of the oscillation power. In consequence, as shown in FIG. 14, the oscillation power obtained when the equilibrium state of oscillation is achieved, can be made smaller than that in the fifth embodiment in the range smaller than that of a conventional oscillator without decreasing the small-signal loop gain.

Seventh Embodiment

The seventh embodiment of the present invention will be described below with reference to FIGS. 15 and 16. Since the oscillator according to the seventh embodiment and the oscillator according to the fifth embodiment shown in FIG. 10 have a lot in common, different points between the oscillator according to the seventh embodiment and the oscillator according to the fifth embodiment will be mainly described below.

Figure 15:
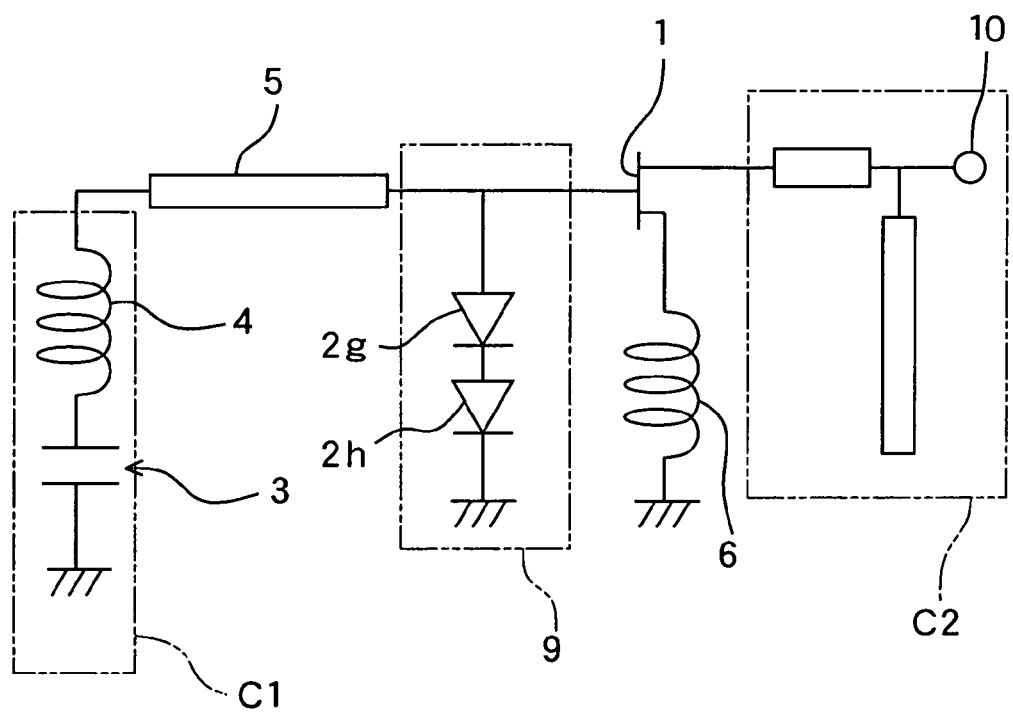
FIG. 15 is a circuit diagram of an oscillator according to the seventh embodiment.
Figure 16:
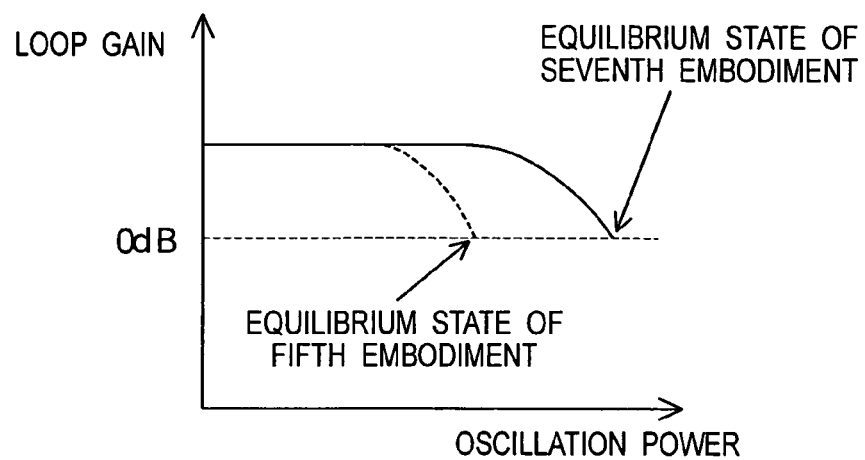
FIG. 16 is a graph showing a relationship between a loop gain and an oscillation power in the oscillator shown in FIG. 15.

FIG. 15 shows the oscillator according to the seventh embodiment. FIG. 16 shows the relationship between the loop gain and the oscillation power in the oscillator shown in FIG. 15. As shown in FIG. 15, in the oscillator according to the seventh embodiment, the amplitude power regulating circuit 9 is provided with two diodes 2g and 2h which are arranged or connected in series with each other in the same direction. The other points are equal to those in the oscillator according to the fifth embodiment. The diodes 2g and 2h may be arranged in the direction opposing the direction in FIG. 15.

In the oscillator according to the seventh embodiment, since the two diodes 2g and 2h are arranged in series with each other in the same direction in the amplitude power regulating circuit 9, voltages applied to the diodes 2g and 2h are lower than those of the fifth embodiment. In consequence, as shown in FIG. 16, the oscillation power obtained when the equilibrium state of oscillation is achieved, can be made larger than that in the fifth embodiment in the range smaller than that of a conventional oscillator without decreasing the small-signal loop gain.

Eighth Embodiment

The eighth embodiment of the present invention will be described below with reference to FIGS. 17 and 18. Since the oscillator according to the eighth embodiment and the oscillator according to the fifth embodiment shown in FIG. 10 have a lot in common, different points between the oscillator according to the eighth embodiment and the oscillator according to the fifth embodiment will be mainly described below.

Figure 17:
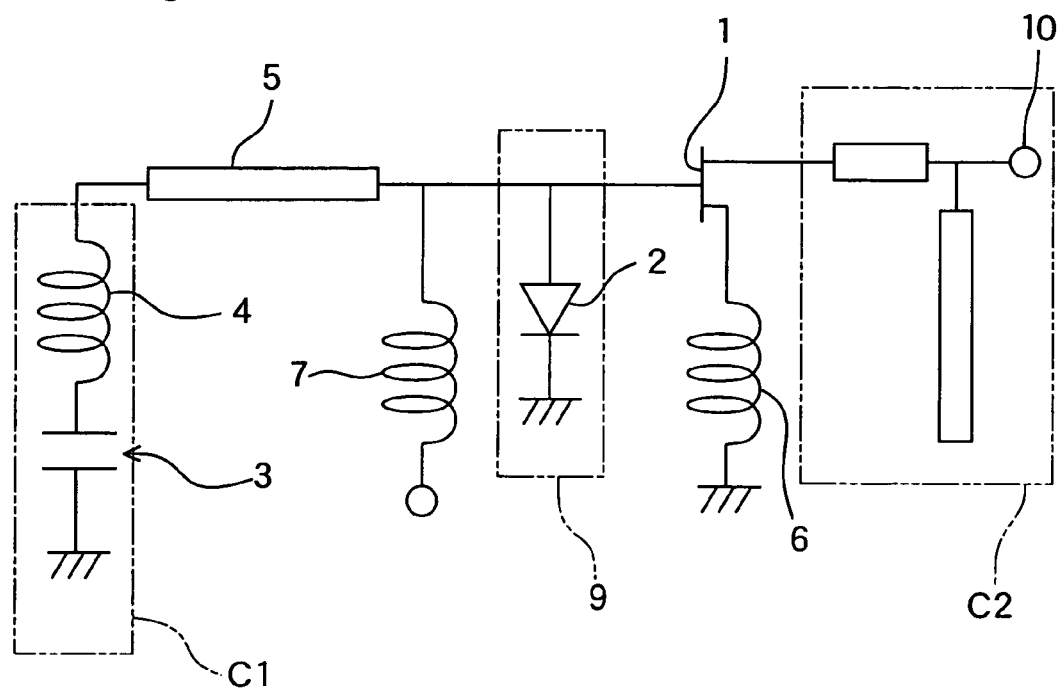
FIG. 17 is a circuit diagram of an oscillator according to the eighth embodiment of the present invention.
Figure 18:
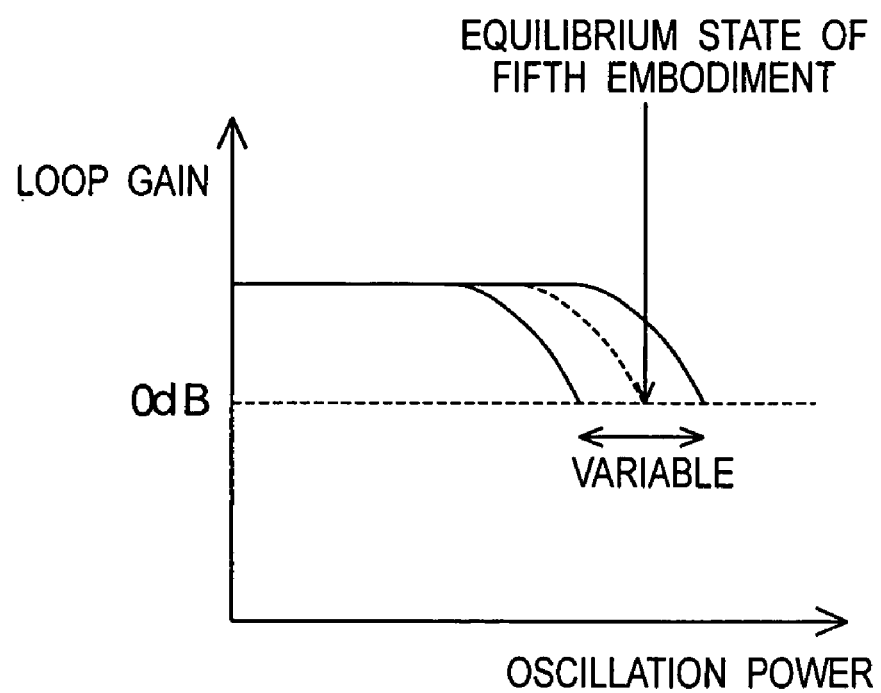
FIG. 18 is a graph showing a relationship between a loop gain and an oscillation power in the oscillator shown in FIG. 17.

FIG. 17 shows the oscillator according to the eighth embodiment. FIG. 18 shows the relationship between the loop gain and the oscillation power in the oscillator shown in FIG. 17. As shown in FIG. 17, in the oscillator according to the eighth embodiment, a choke inductor 7 for applying DC biases to the diode 2 is connected to the line between the transmission line 5 and the amplitude power regulating circuit 9. The other points are the same as those in the oscillator according to the fifth embodiment. The diode 2 may be arranged in the direction opposing the direction of the diode 2 in FIG. 17.

In the oscillator according to the eighth embodiment, since the DC biases can be applied to the diode 2, the center voltage of the amplitude of the high-frequency voltage applied to the diode 2 can be set to an arbitrary voltage. In consequence, as shown in FIG. 18, the oscillation power obtained when the equilibrium state of oscillation is achieved, can be made equal to an arbitrary value in the range smaller than that of a conventional oscillator without decreasing the small-signal loop gain.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A semiconductor integrated circuit device comprising:
   a resonant circuit resonating at an arbitrary frequency;
   a transmission line for transmitting a high-frequency signal having the frequency, wherein a first end of said transmission line is connected to said resonant circuit;
   an active element having a first electrode connected to a second end of said transmission line, a second electrode which is grounded through a reactance element, and a third electrode;
   an output-matching circuit including a diode section for regulating an oscillation power and a high-frequency signal output terminal, wherein a first end of said diode section is connected to said third electrode of said active element, and said high-frequency signal output terminal is connected to a second end of said diode section; and
   a substrate having a main surface on which said resonant circuit, said transmission line, said active element, and said output-matching circuit are arranged.

2. The semiconductor integrated circuit device according to claim 1, wherein said diode section includes a plurality of diodes connected in an inverse parallel arrangement.

3. The semiconductor integrated circuit device according to claim 1, wherein said diode section includes a plurality of diodes connected in series.

4. The semiconductor integrated circuit device according to claim 1, further comprising a bias circuit for applying a DC bias to said diode section.

* * * * *